United States Patent
Gandhi et al.

(10) Patent No.: US 11,373,989 B1
(45) Date of Patent: Jun. 28, 2022

(54) PACKAGE INTEGRATION FOR LATERALLY MOUNTED IC DIES WITH DISSIMILAR SOLDER INTERCONNECTS

(71) Applicant: XILINX, INC., San Jose, CA (US)

(72) Inventors: Jaspreet Singh Gandhi, San Jose, CA (US); Suresh Ramalingam, Fremont, CA (US)

(73) Assignee: XILINX, INC., San Jose, CA (US)

( * ) Notice: Subject to any disclaimer, the term of this patent is extended or adjusted under 35 U.S.C. 154(b) by 48 days.

(21) Appl. No.: 17/006,745

(22) Filed: Aug. 28, 2020

(51) Int. Cl.
| | |
|---|---|
| *H01L 25/18* | (2006.01) |
| *H01L 25/00* | (2006.01) |
| *H01L 23/00* | (2006.01) |

(52) U.S. Cl.
CPC .............. *H01L 25/18* (2013.01); *H01L 24/19* (2013.01); *H01L 24/20* (2013.01); *H01L 25/50* (2013.01); *H01L 2924/1431* (2013.01); *H01L 2924/1434* (2013.01); *H01L 2924/3512* (2013.01)

(58) Field of Classification Search
CPC ......... H01L 25/18; H01L 24/19; H01L 24/20; H01L 25/50; H01L 2924/3512; H01L 2924/1431; H01L 2924/1434; H01L 23/5226; H01L 24/24; H01L 24/25; H01L 24/82; H01L 2225/1058; H01L 21/76885; H01L 2021/60045; H01L 2021/60232; H01L 23/488; H01L 24/17; H01L 2224/05008
See application file for complete search history.

(56) References Cited

U.S. PATENT DOCUMENTS

| | | | |
|---|---|---|---|
| 6,184,062 B1 | 2/2001 | Brofman et al. | |
| 6,559,527 B2 | 5/2003 | Brofman et al. | |
| 7,224,071 B2 | 5/2007 | Odegard | |
| 8,288,201 B2 | 10/2012 | Pagaila et al. | |
| 9,147,661 B1 | 9/2015 | Kwon et al. | |
| 9,418,966 B1 | 8/2016 | Kwon et al. | |
| 2002/0079577 A1 | 6/2002 | Ho | |
| 2003/0193093 A1 | 10/2003 | Brofman et al. | |

(Continued)

OTHER PUBLICATIONS

Lau, John, MCM, SiP, SoC, and Heterogeneous Integration Defined and Explained, 3DInCites, Aug. 7, 2017.

(Continued)

*Primary Examiner* — Thanh Y. Tran
(74) *Attorney, Agent, or Firm* — Patterson + Sheridan, LLP

(57) ABSTRACT

A chip package assembly and method of fabricating the same are described herein. The chip package assembly generally includes at least one integrated circuit (IC) die that has had the original solder interconnects at least partially replaced to enhance the reliability of a redistribution layer disposed between the IC die and the substrate. In the resulting chip package assembly, at least one IC die includes first and second pillars extending from exposed contact pads through a first mold compound. The second pillars are fabricated from a material that has a composition different than that of the first pillars. A redistribution layer is formed on the first and second pillars. The solder interconnects mechanically couple the redistribution layer to landing pads of a substrate. The solder interconnects also electrically couple circuitry of the substrate to the circuitry of the IC die through the redistribution layer and first and second pillars.

20 Claims, 14 Drawing Sheets

(56) References Cited

U.S. PATENT DOCUMENTS

| | | | |
|---|---|---|---|
| 2009/0152738 A1 | 6/2009 | Sathe et al. | |
| 2011/0248398 A1 | 10/2011 | Parvarandeh et al. | |
| 2013/0193593 A1* | 8/2013 | Lin | H01L 24/13 257/737 |
| 2015/0200169 A1* | 7/2015 | Wang | H01L 24/73 257/737 |
| 2015/0262949 A1* | 9/2015 | Osenbach | H01L 24/05 438/113 |
| 2016/0240508 A1* | 8/2016 | Hou | H01L 25/50 |
| 2019/0103375 A1* | 4/2019 | Huang | H01L 21/565 |

OTHER PUBLICATIONS

Iyer, Subu, "CHIPS", UCLA Engineering, Henry Samueli School of Engineering and Applied Science, Powerpoint.
U.S. Appl. No. 16/289,975, filed Mar. 1, 2019 Entitled "Package Integration for High Bandwidth Memory".

* cited by examiner

PACKAGE INTEGRATION FOR LATERALLY MOUNTED IC DIES WITH DISSIMILAR SOLDER INTERCONNECTS

TECHNICAL FIELD

Embodiments of the present disclosure generally relate to chip packages and electronic devices having the same. In particular, to chip packages having at laterally spaced integrated circuit (IC) dies having solder interconnects at initially dissimilar heights.

BACKGROUND ART

Electronic devices, such as tablets, computers, server, in-door telecom, out-door telecom, industrial computers, high performance computing data centers, copiers, digital cameras, smart phones, control systems and automated teller machines, among others, often employ electronic components which leverage chip packages for increased functionality and higher component density. Conventional chip packages include one or more stacked components such as integrated circuit (IC) dies, through-silicon-via (TSV) interposer, and a package substrate, with the chip package itself stacked on a printed circuit board (PCB). The IC dies may include memory, logic, MEMS, RF or other IC device.

In flip-chip mounting and connection methods, thermomechanical reliability is becoming an increasing concern of the electronics industry. Notably, the reliability of the integrated circuit interconnects, e.g., solder joints, is one of the most critical issues for successful application of such mounting and connection methods. Some chip package assemblies utilized redistribution layers to fan out the routing between contact pads on the IC dies and the solder connection to a package substrate. However, redistribution layers formed using known methods are prone to cracking, which may lead to failure of the solder joint and IC device itself. The propensity for cracking is even more problematic in packages having a first die with a solder joint that extends further from the first die than a solder joint of a second die interfacing with the same redistribution layer, i.e., the solder joints of the first and second dies have initially dissimilar pillar heights. Problematically, high mismatching of solder joints requires significant pillar grinding to accommodate tolerance stacks, resulting in crack initiations that are later propagated into the redistribution layer causing damage to the routings within the redistribution layer.

Therefore, there is a need for improved integrated circuit interconnects and methods of forming improved solder joints for an integrated circuit.

SUMMARY

A chip package assembly and method of fabricating the same are described herein. The chip package assembly generally includes at least one integrated circuit (IC) die that has had the original solder interconnects at least partially replaced to enhance the reliability of a redistribution layer disposed between the IC die and the package substrate.

In one example, the chip package assembly includes a substrate, a first integrated circuit (IC) die, a first mold compound, first copper pillars, second copper pillars, a redistribution layer and solder interconnects. The substrate has circuitry terminating at exposed landing pads. The first IC die also has circuitry terminating at exposed contact pads. The first mold compound encapsulates the first IC die. The first copper pillars extend from the exposed contact pads of the first IC die through the first mold compound, and are fabricated from a first copper material. The second copper pillars extend from the first copper pillars through the first mold compound, and are fabricated from a second copper material that has a composition different than that of the first copper material. The redistribution layer is formed on the first and second copper pillars. The solder interconnects mechanically couple the redistribution layer to the landing pads of the substrate. The solder interconnects also electrically couple the circuitry of the substrate to the circuitry of the first IC die through the redistribution layer and first and second copper pillars.

In another example, a chip package assembly is provided that is manufactured by a method that includes: removing, from a first integrated circuit (IC) die encapsulated in a first mold compound, solder from first conductive pillars extending from a surface of the first IC die; forming second conductive pillars on the first conductive pillars from a copper material having a composition different than that of the first conductive pillars; forming a redistribution layer on the first and second conductive pillars; and forming solder connections to mount the redistribution layer to a substrate, the solder connections electrically coupling circuitry of the substrate to circuitry of the first IC die through the redistribution layer and the first and second conductive pillars.

In yet another example, a method for fabricating a chip package assembly is provided that includes: removing, from a first integrated circuit (IC) die encapsulated in a first mold compound, solder from first conductive pillars extending from a surface of the first IC die; forming second conductive pillars on the first conductive pillars; forming a redistribution layer on the first and second conductive pillars; and forming solder connections to mount the redistribution layer to a substrate, the solder connections electrically coupling circuitry of the substrate to circuitry of the first IC die through the redistribution layer and the first and second conductive pillars.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. It is contemplated that elements of one embodiment may be beneficially incorporated in other embodiments.

DETAILED DESCRIPTION

Examples described herein generally provide chip package assemblies having at least two dies mounted laterally to a substrate and methods of fabricating the same. The chip package assemblies described herein generally include at least one integrated circuit (IC) die having the original solder interconnects at least partially replaced to enhance the reliability of a redistribution layer disposed between the IC die and the package substrate in chip packages having a neighboring IC die with solder interconnects having different initial heights. Consequently, the amount of material removal required to make pillars of the neighboring IC dies coplanar is significantly reduced compared to conventional design, which substantially prevents cracking and damage to the redistribution layer disposed between the IC die and the package substrate. As a result, the neighboring IC dies are connected to the substrate with a more robust and reliable solder joint, and accordingly, form a more robust, reliable and better performing chip package. Replacing at least a portion of the solder interconnect is particularly advantageous in chip packages having two or more laterally spaced IC dies that have dissimilar (i.e., heterogeneous) solder joint heights prior to forming the redistribution layer on the IC dies. Utilizing dissimilar solder joint heights can result in stress transfer to, and ultimately cracking of the redistribution layer. Heavily grinding the dissimilar solder joint heights also increases the risk of cracking of the redistribution layer. The above improvements are particularly useful in chip packages that integrate a stack of HBM (high bandwidth memory) dies having one solder joint height with an adjacent logic die having a different solder joint height within a single package. It is also contemplated that the process described herein may also be employ to fabricate a chip package assembly having a single IC die.

Figure 1:
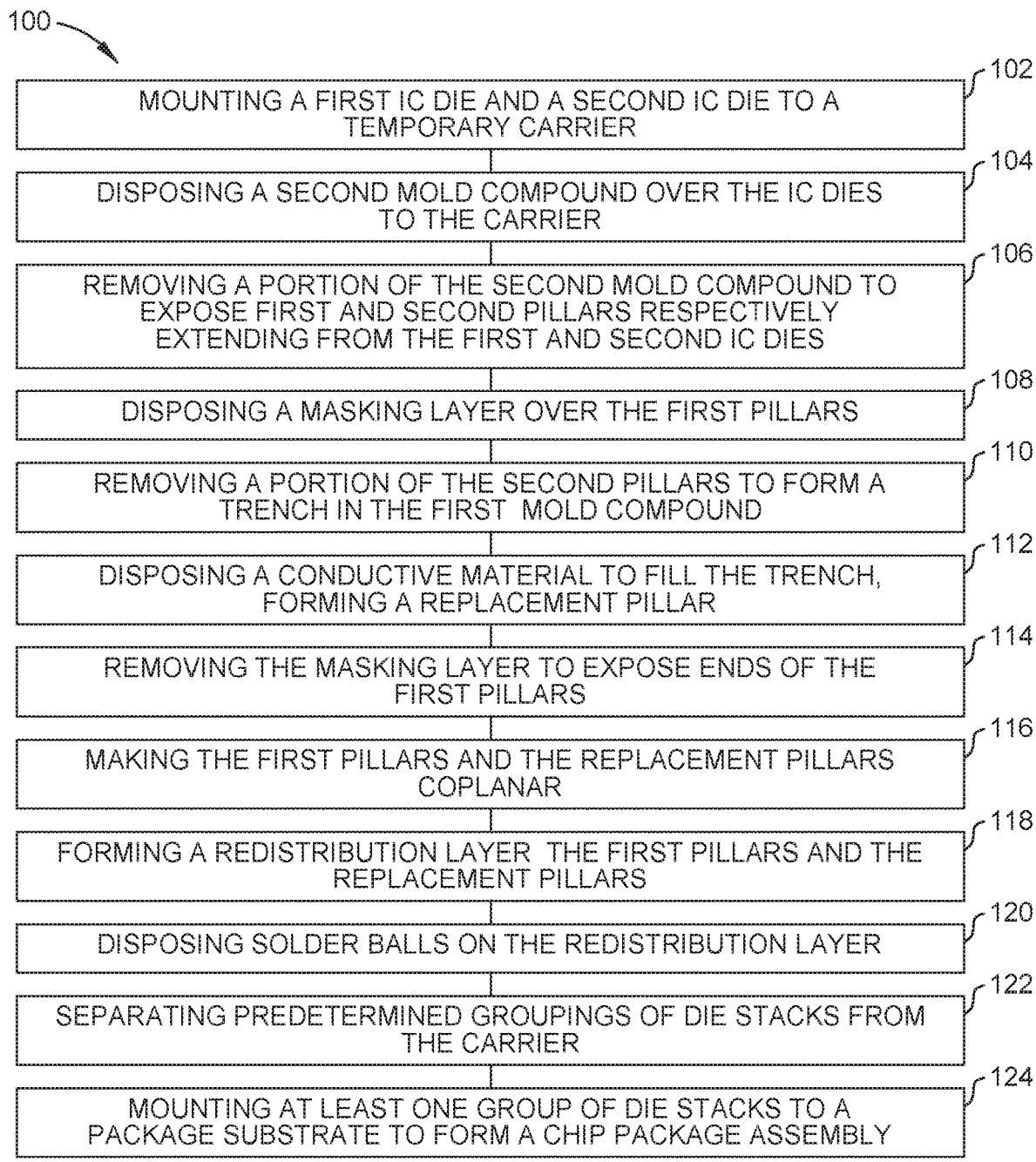
FIG. 1 is a flow diagram of a method of fabricating an integrated circuit (IC) chip package assembly having at least two dies mounted laterally to a substrate.

Turning now to FIG. 1, a method 100 for fabricating a chip package assembly is provided. FIGS. 2-15 correspond to the different stages of the method 100. Although mounting of two laterally spaced IC dies are described with reference to FIG. 1, the method 100 may be adapted to connect any number of IC dies to a substrate, including for example, a single IC die, a single IC die stack, multiple laterally spaced IC dies and/or IC die stacks, and the like. Additionally, although the method 100 is illustrated as ultimately fabricating a chip package assembly in the form of a high bandwidth memory device, the method 100 can be readily adapted to fabricate other types of devices, including those with or without memory dies.

Figure 2:
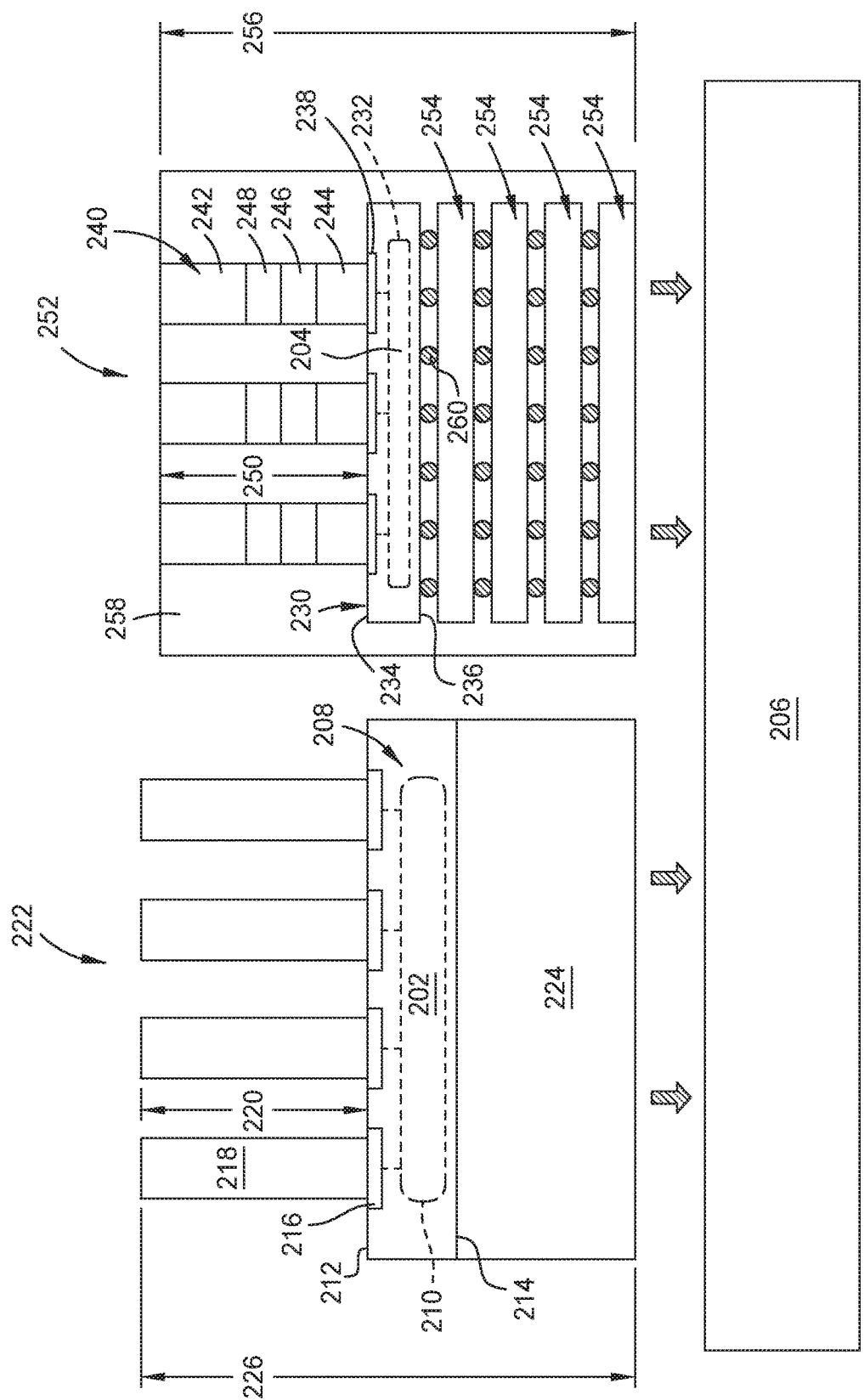
FIGS. 2-15 are cross sectional schematic view of an integrated circuit (IC) chip package assembly during different stages of fabrication sequence in accordance with the method of FIG. 1.

The method 100 begins at operation 102 by mounting a first IC die 202 and a second IC die 204 to a temporary carrier 206, as illustrated in FIG. 2. The carrier 206 is fabricated from a suitable rigid material, such as silicon, glass ceramic, or rigid plastic, among others. The IC dies 202, 204 are secured to the carrier 206 using a temporary adhesive to allow debonding of the IC dies 202, 204 from the carrier 206 later in the fabrication process.

The first IC die 202 has a die body 208 in which functional circuitry 210 is formed. The die body 208 also includes a first side 212 and a second side 214. The first and second sides 212, 214 are disposed on opposite sides of the die body 208, with the second side 214 facing the carrier 206.

The functional circuitry 210 generally provides the functionality of the die, for example, processing and memory, among others. The functional circuitry 210 of the first IC die 202 may be configured logic device, such as field programmable gate array (FPGA), memory device, optical device, processor or other IC logic structure. The functional circuitry 210 of the first IC die 202 may alternatively be configured as an optical device, such as a photo-detector, laser, optical source, and the like. In the example depicted in FIG. 2, the functional circuitry 210 of the first IC die 202 is configured as a logic device, such as a processor.

The functional circuitry 210 disposed with the die body 208 terminates at contact pads 216 exposed on the first side 212 of the die body 208. First conductive pillars 218 extend from the contact pads 216 away from the first side 212 of the die body 208. The first conductive pillars 218 are generally fabricated from copper or other conductive material suitable for transmitting signals, ground and power to the functional circuitry 210 of the first IC die 202. The first conductive pillars 218 have a height 220 measured normally to the first side 212.

The first IC die 202 may optionally be part of an optional first die stack 222. In the example depicted in FIG. 2, the first die stack 222 includes one or more secondary dies 224 mounted to the second side 212 of the first IC die 202. The secondary die 224 furthest from the first IC die 202 is mounted to the carrier 206 utilizing the temporary adhesive. One or more of the one or more secondary dies 224 may optionally be functional dies, such as logic or memory dies. One or more of the one or more secondary dies 224 may optionally be non-functional dies, also known as dummy dies. In the example depicted in FIG. 2, the first die stack 222 includes one secondary die 224 configured as a dummy die that couples the first IC die 202 to the carrier 206. A height of the first die stack 222 is depicted in FIG. 2 by reference numeral 226.

The second IC die 204 is mounted to the carrier 206 laterally adjacent to the first IC die 202. Although only two laterally spaced IC dies 202, 204 are illustrated in FIG. 2, any number of laterally spaced IC dies may be mounted to the carrier 206 as space permits.

The second IC die 204 has a die body 230 in which functional circuitry 232 is formed. The die body 230 also includes a first side 234 and a second side 236. The first and second sides 234, 236 are disposed on opposite sides of the die body 230, with the second side 236 facing the carrier 206.

The functional circuitry 232 generally provides the functionality of the second IC die 204, for example, processing or memory, among other functionality. The functional circuitry 232 of the second IC die 204 may be configured programmable logic device, such as field programmable gate array (FPGA), memory device, optical device, processor or other IC logic structure. The functional circuitry 232 of the second IC die 204 may alternatively be configured as an optical device, such as a photo-detector, laser, optical source, and the like. In the example depicted in FIG. 2, the functional circuitry 232 of the second IC die 204 is configured as an input/output device, such as a passive routing device, with little or no active (logic) circuit elements as compared to the first IC die 202.

The functional circuitry 232 disposed with the die body 230 terminates at contact pads 238 exposed on the first side 234 of the die body 230. Second conductive pillars 240 extend from the contact pads 238 away from the first side 234 of the die body 230. The second conductive pillars 240 are generally fabricated from a stack of different conductive materials, terminating in a solder layer 242. In the example depicted in FIG. 2, the second conductive pillar 240 includes a first copper layer 244 disposed in contact with the contact pad 238, a nickel layer 246 disposed on the first copper layer 244, a second copper layer 248 disposed on the nickel layer 246, and the solder layer 240 disposed on the second copper layer 248. Alternatively, the pillar 240 may be composed of additional or fewer materials disposed between the solder layer 242 and the contact pad 238. Generally, the stack of different conductive materials comprising second conductive pillars 240 are suitable for transmitting signals, ground and power to the functional circuitry 232 of the second IC die 204.

The second conductive pillars 240 have a height 250 measured normally to the first side 234. Particularly in embodiments where the first and second dies 202, 204 are fabricated at either different facilities or by different manufacturers, the height 220 of the first conductive pillars 218 is often different than the height 250 of the second conductive pillars 240. The difference in heights 220, 250 can create uncontrolled collapse of the solder joints when reflowing the solder joints coupling the 202, 204 to the carrier 206. The difference in heights 220, 250 can be corrected by grinding a significant amount of pillar material to make the pillars 218, 240 coplanar after mounting to the carrier 206. However, heavily grinding the pillars 218, 240 to make them coplanar often creates cracking or stress issues that lead to other types of defects. For example, if one of the pillars 218, 240 is ground close to its associated contact pad, mold compound surrounding the pillars 218, 240 can become highly susceptible to cracking. To avoid the problems associated with large scale grinding of the pillars 218, 240, a portion of the pillars 218 and/or a portion of the pillars 240 is removed and replaced such that make the pillars 218, 240 substantially coplanar such that any grinding required to make the pillars 218, 240 is comparatively small, and thus substantially avoiding crack and stress associated issues as compared to conventional package assemblies that undergo large scale grinding.

Similar to the first IC die 202, the second IC die 204 may be part of an optional second die stack 252. In the example depicted in FIG. 2, the second die stack 252 includes one or more secondary dies 254 mounted to the second side 234 of the second IC die 204. The secondary die 254 may be electrically and mechanically connected by solder bumps 260. The secondary die 254 furthest from the second IC die 204 is disposed closest to the carrier 206 when the second die stack 252 is mounted to the carrier 206 utilizing the temporary adhesive. One or more of the one or more secondary dies 254 may optionally be logic or memory dies. One or more of the one or more secondary dies 254 may optionally be non-functional dies. In the example depicted in FIG. 2, the second die stack 252 includes a plurality of secondary dies 254 configured as a memory dies that are stacked on the second IC die 204 configured as an input/output die. For example, the second die stack 252 is configured as a high bandwidth memory chip stack.

The second die stack 252 has a height 256. Although not required, the height 256 may be substantially the same as the height 226 of the first die stack 222. Having the heights 226, 256 being substantially equal facilitates ease of assembly.

The second die stack 252 additionally includes a first mold compound 258 disposed around the IC dies 204, 254. The first mold compound 258 is disposed around the IC dies 204, 254 prior to attachment to the carrier 206. The first mold compound 258 may be an epoxy or other suitable dielectric material. The first mold compound 258 may also surround the second pillars 240. The second die stack 252 is generally provided disposed in the first mold compound 258 as shipped by the manufacturer. At least a portion of the solder layer 240 of the second pillars 240 are exposed through the first mold compound 258. The first mold compound 258 may also extends over or be coplanar with the secondary die 254 furthest from the second IC die 204 so that the first mold compound 258 is secured to the carrier 206 utilizing the temporary adhesive, thus mounting the second die stack 252 to the carrier 206.

Figure 3:
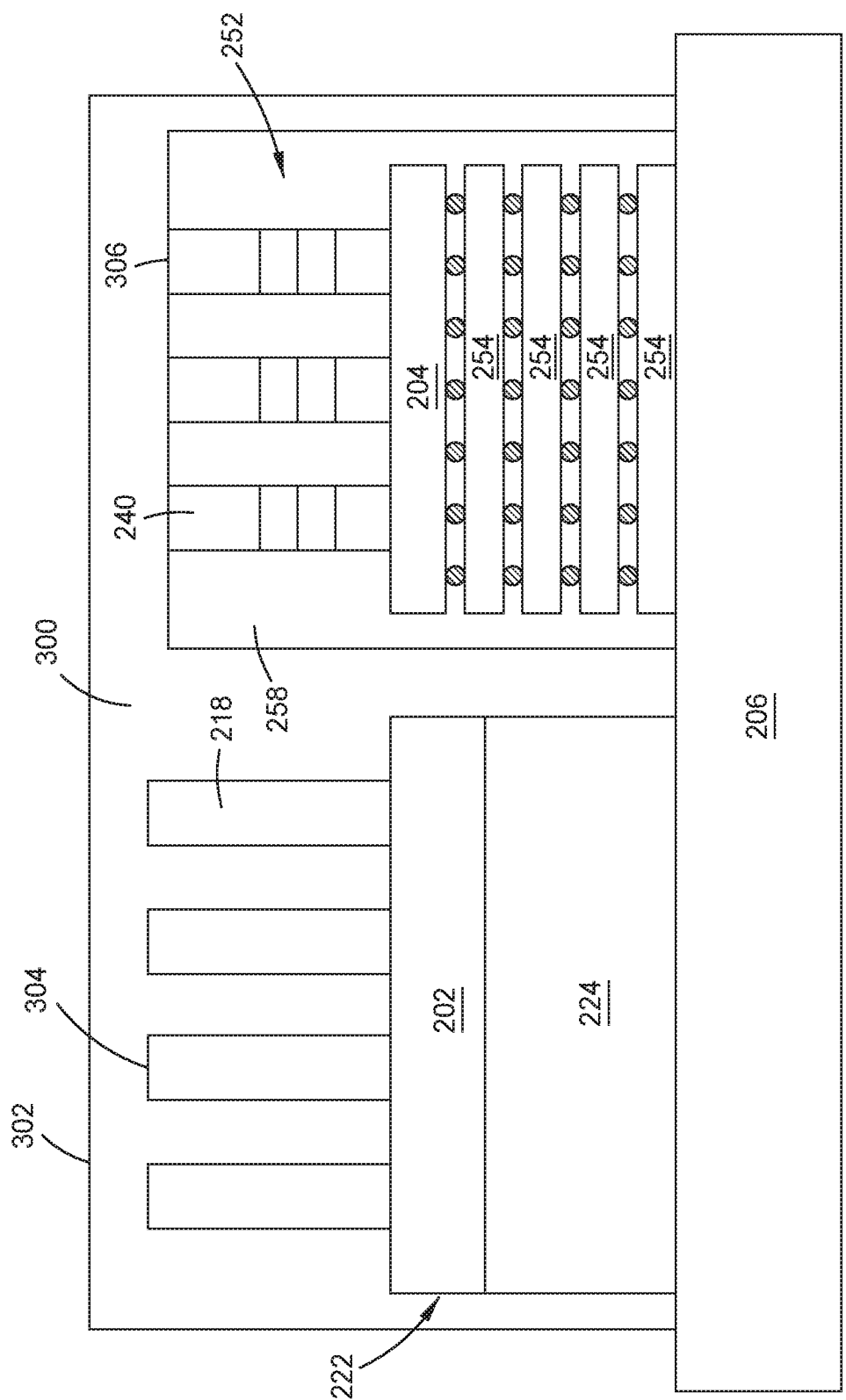

At operation 104, a second mold compound 300 is disposed over the IC dies 202, 204 attached to the carrier 206, as illustrated in FIG. 3. The second mold compound 300 may be deposited over the IC dies 202, 204 and carrier 206 utilizing an overmolding or other suitable technique. The second mold compound 300 generally covers the first and second die stacks 222, 252 such that a surface 302 of the second mold compound 300 farthest from the carrier 206 covers the distal ends 304, 306 of the pillars 218, 240. The second mold compound 300 is disposed between and laterally surrounds the pillars 218 of the first die 202. The second mold compound 300 additionally covers the lateral sides of the second die stack 252, over and encapsulating the first mold compound 258. The second mold compound 300 is also disposed laterally between the first and second IC dies 202, 204, thus filling the gap between the first and second die stacks 222, 252. The second mold compound 300 is additionally in contact with the carrier 206 between and to the sides of the first and second die stacks 222, 252. The second mold compound 300 may be an epoxy or other suitable dielectric material.

Figure 4:
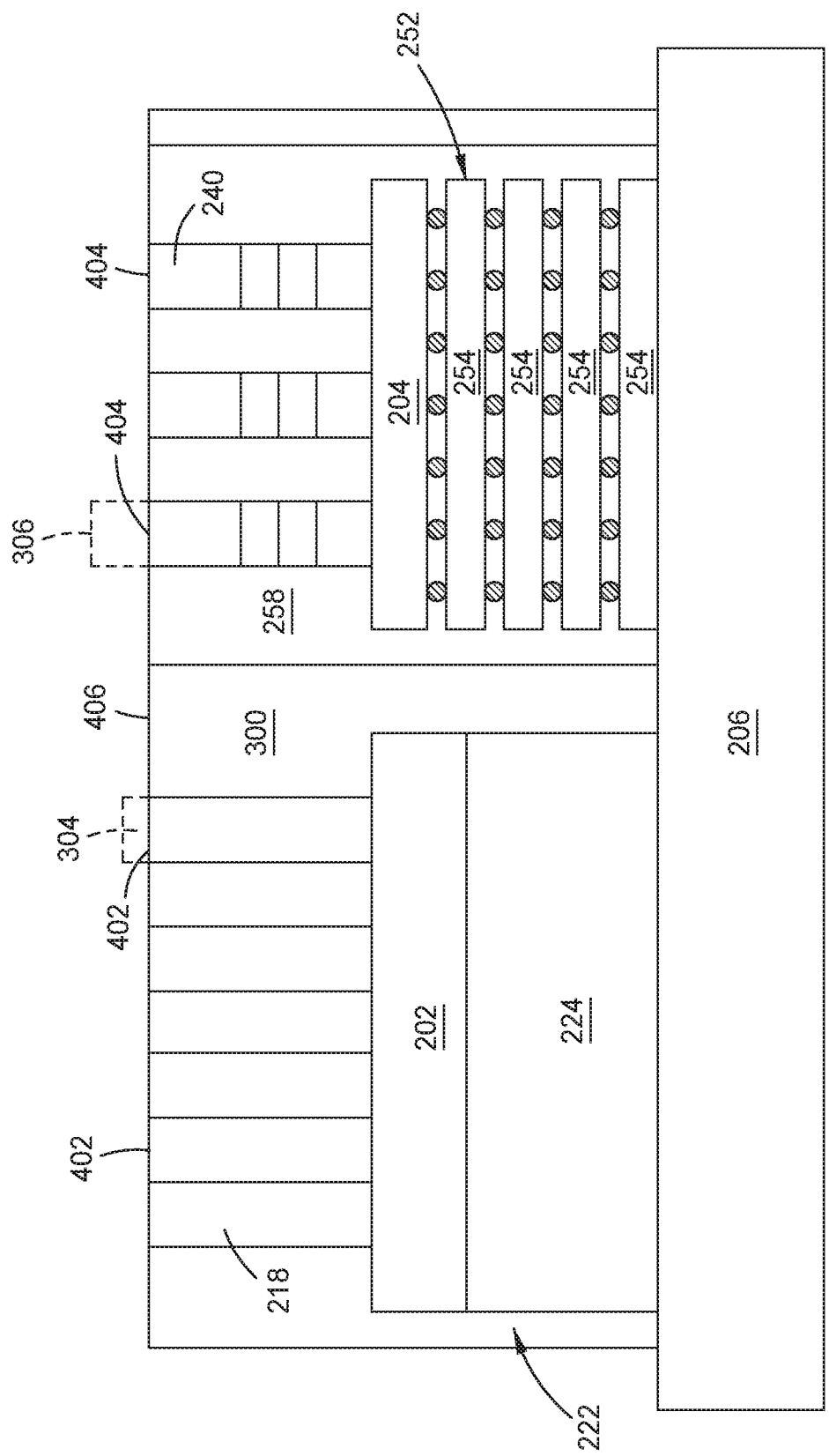

At operation 106, a portion of the second mold compound 300 is removed to expose the pillars 218, 240, as illustrated in FIG. 4. For example, a portion of the second mold compound 300 farthest from the carrier 206 is removed at operation 106. Operation 106 may also remove a portion of at least one or more of the distal ends 304, 306 of the pillars 218, 240 farthest from the carrier 206 such that resultant surfaces 402, 404, 406 respectively of the first pillars 218, second pillars 240 and the mold compounds 258, 300 are made coplanar. For clarity, the resultant surface 406 refers to the newly exposed and coplanar surfaces of the mold compounds 258, 300. The ends and surfaces 402, 404, 406 may be made coplanar by milling, etching, grinding or other suitable technique. In one example, the surfaces 402, 404, 406 are only ground such that most of the pillars 218, 240 remain intact. That is after grinding, the remaining heights of the pillars 218, 240 is only slightly less than the original height of the shortest pillar 218, 240. In this manner, the mold compounds 258, 300 are not subjected to excessive grinding so that stress and crack initiation are essentially prevented.

Figure 5:
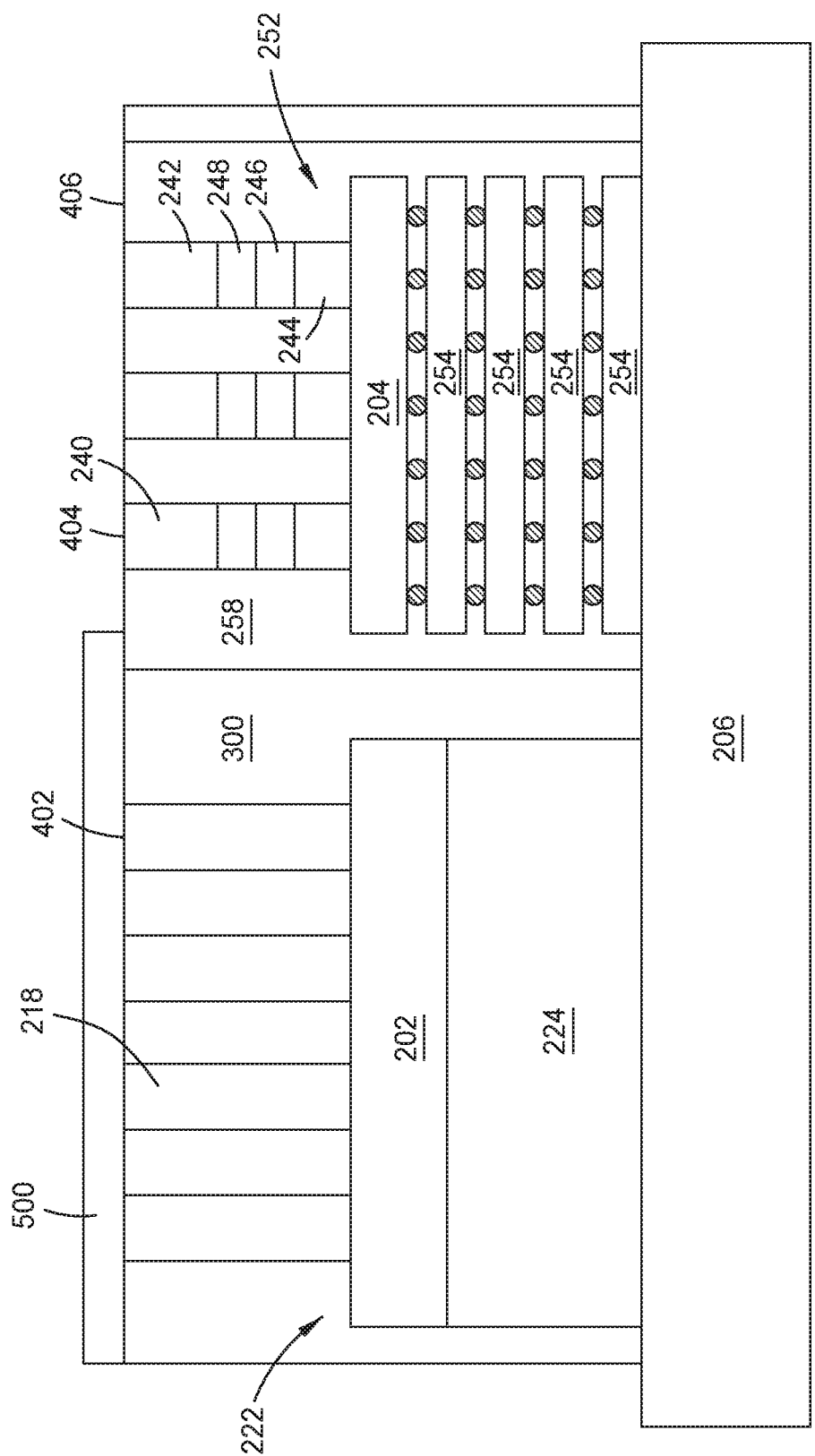

At operation 108, a mask layer 500 is disposed over the first pillars 218, as illustrated in FIG. 5. The mask layer 500 may be spun on or deposited utilizing other techniques. The mask layer 500 may be a polymeric photoresist that is patterned to cover the ends 404 of the first pillars 218 while leaving the ends 406 of the second pillars 240 exposed. The mask layer 500 may be patterned using conventional lithography or other suitable techniques. The mask layer 500 may alternatively be fabricated from another suitable masking material.

Figure 6:
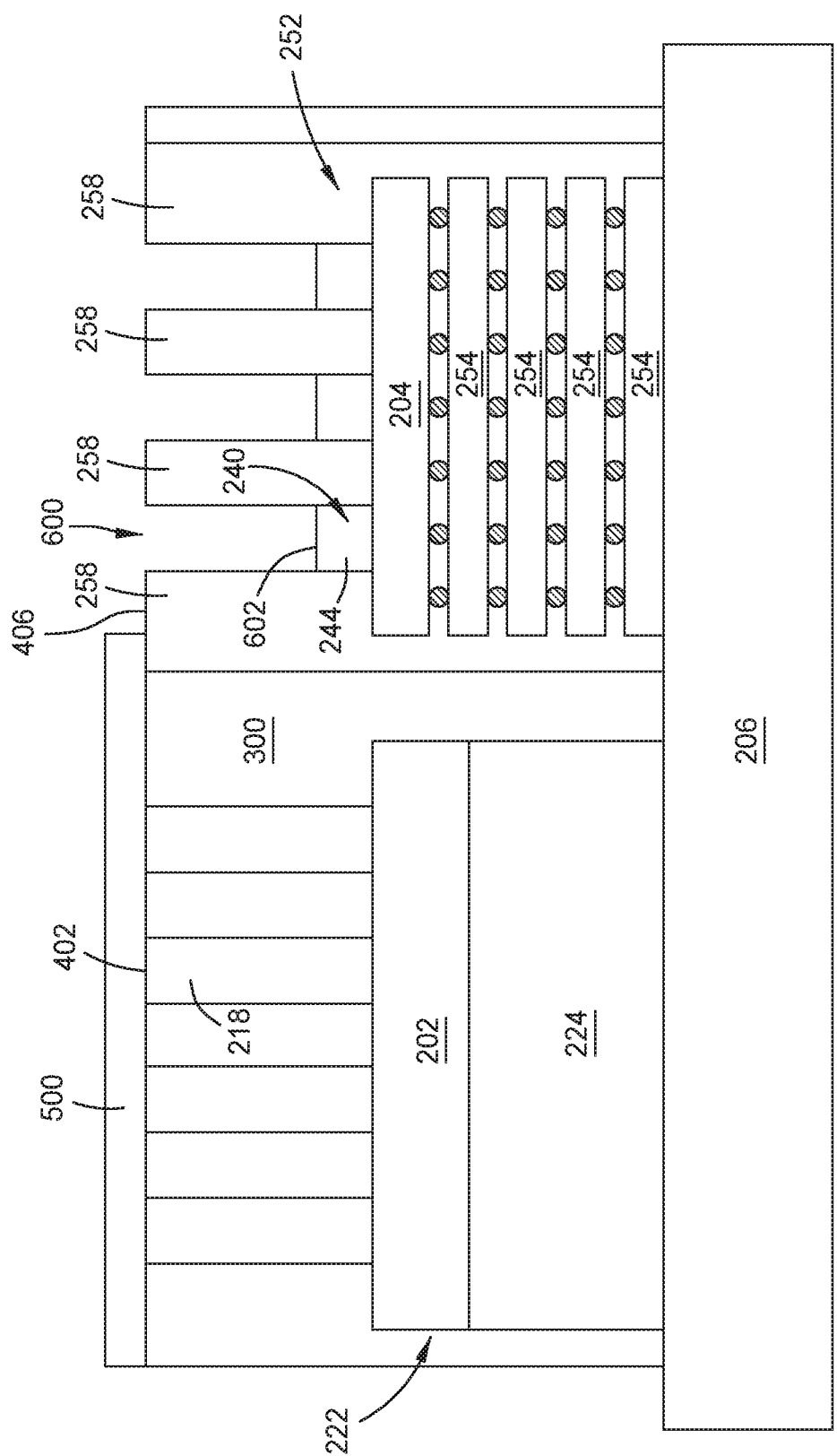

At operation 110, a portion of the second pillars 240 is removed, as illustrated in FIG. 6. A trench 600 in the first mold compound 258 is formed by the removal of the portion of the second pillars 240. An exposed surface 602 of the second pillars 240 forms the bottom of the trench 600. The portion of the second pillars 240 may be removed by etching, milling or other suitable technique. The mask layer 500 prevents the first pillars 218 from being removed or shortened during operation 110.

Operation 110 removes at least the solder layer 240 from the second pillars 240. Operation 110 may also remove portions or all of the layers 246, 248. In the example depicted in FIG. 6, operation 110 removes all of the layers 240, 246, 248 such that the exposed surface 602 of the remaining portion of the second pillars 240 is defined by the exposed the copper layer 244 that is in contact with the contact pad 238 (shown in FIG. 2).

Figure 7:
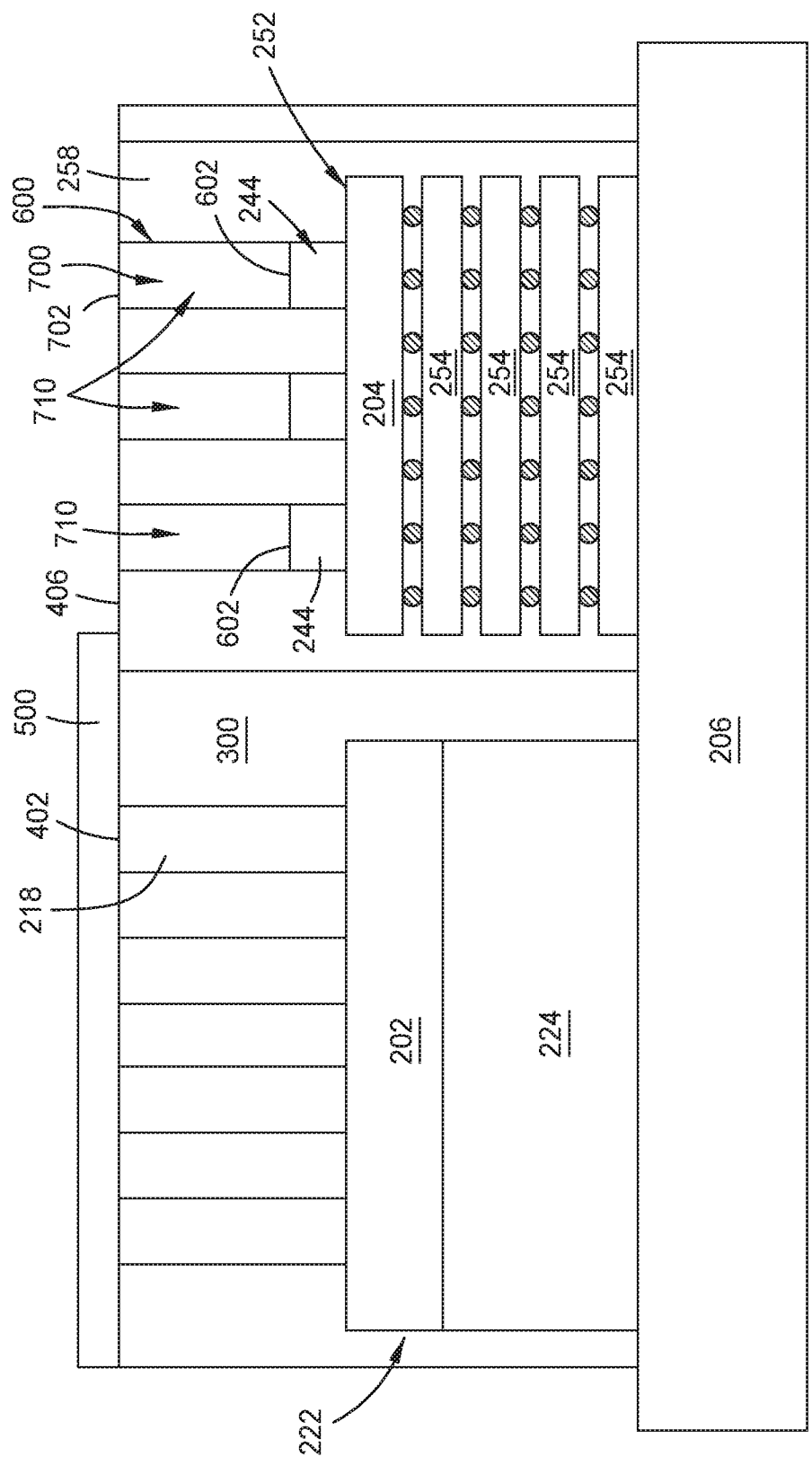

At operation 112, a conductive material 700 is disposed on the exposed surface 602 of the copper layer 244 to fill the trench 600, forming a replacement pillar 710 as illustrated in FIG. 7. The conductive material 700 may be fabricated from copper or other conductive material suitable for transmitting signals, ground and power to the functional circuitry 232 of the second IC die 204. In one example, the conductive material 700 is copper. Copper may be deposited on the surface 602 of the copper layer 244 by plating, such as electroplating, electro-less plating or other suitable conductive material depositing technique.

Figure 8:
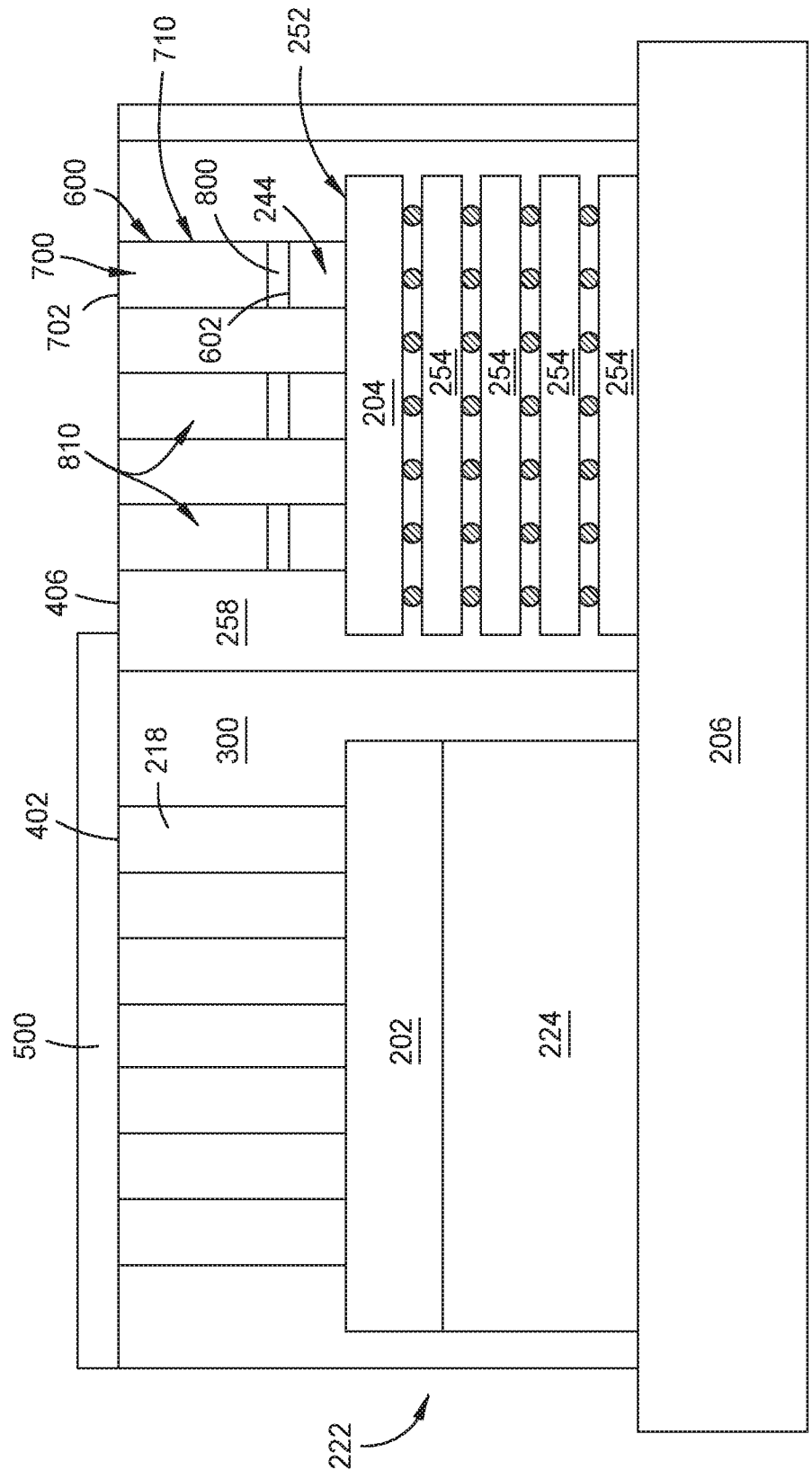

If operation 112 deposits copper via electroplating, a seed layer 800 maybe disposed between the copper layer 244 and the conductive material 700, as illustrated in FIG. 8. When utilized, the seed layer 800 may be copper, titanium, tungsten or other suitable material.

Referring back to FIG. 7, the conductive material 700 generally has a different composition than the underlying copper layer 244. For example, the underlying copper layer 244 generally has a polycrystalline composition and or a relatively high purity level, while the conductive material 700 generally has plating contaminants. For example, the conductive material 700, when deposited via electroless plating, includes a copper composition contaminated by reducing agents, such as phosphorous.

A distal end 702 of the conductive material 700 disposed farthest from the copper layer 244 is exposed through the top of the trench 600. Although the distal ends 702 of the conductive material 700 and the distal ends 402 of the pillars 218 may be and appear to be coplanar in the illustration of FIG. 7, the ends 402, 702 generally are not coplanar, extending to different heights from the carrier 206.

Optionally, operation 110 may also be configured to remove a portion of the first mold compound 258 along with a portion of the pillars 240 such that the a portion of the sides of the pillars 240 below the surface 602 are also exposed to the trench 600. Thus, the conductive material 700 deposited at operation 112 also contacts the exposed sides of the pillars 240 below the surface 602 of the pillars 240, making a more robust connection between the conductive material 700 and the remaining portion of the pillars 240.

Figure 9:
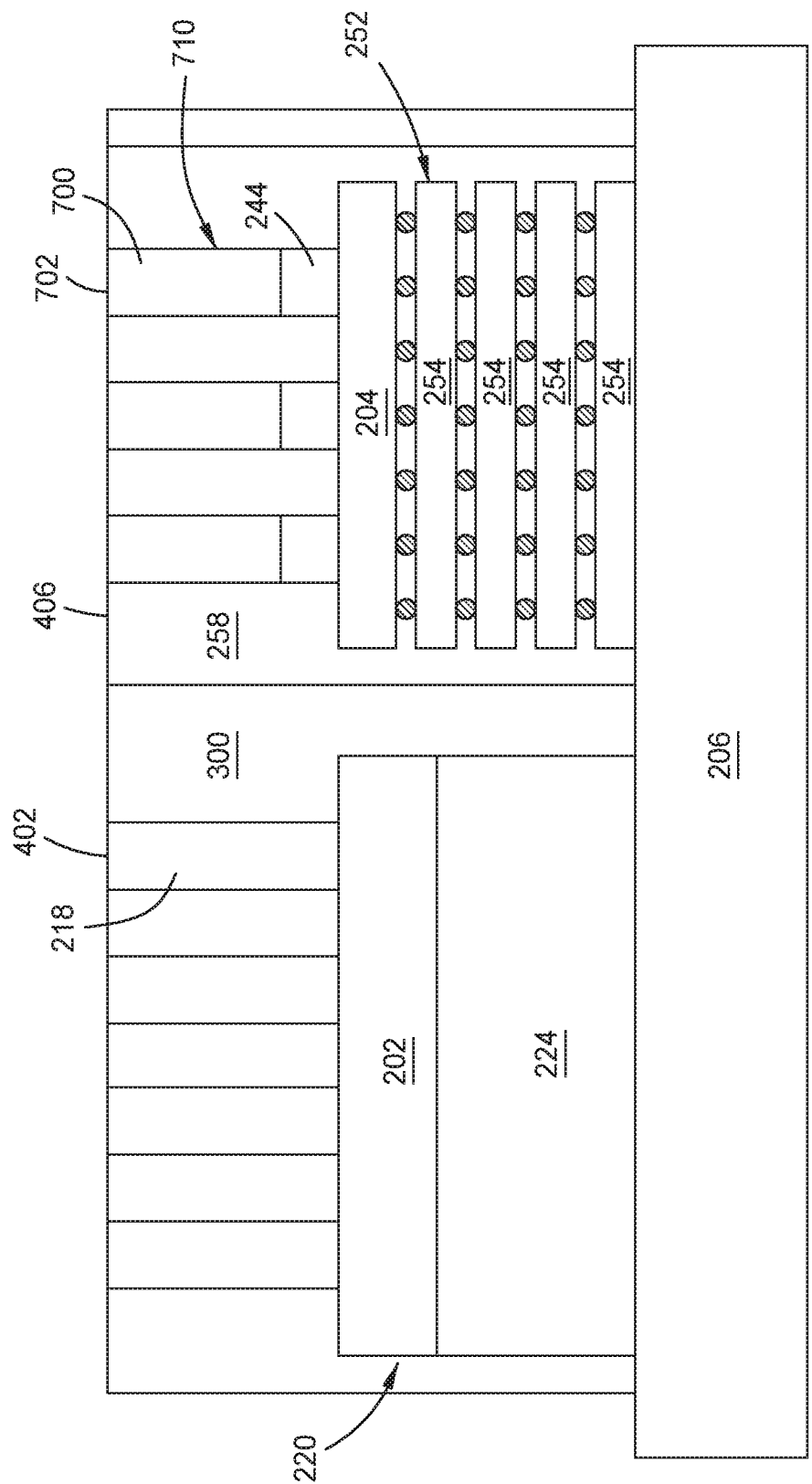

At operation 114, the mask layer 500 is removed to expose the ends 402 of the first pillars 218, as illustrated in FIG. 9. The mask layer 500 may be removed by selectively etching, ashing or other suitable technique. The mask layer 500 removed at operation 114 leaves the distal ends 402 of the pillars 218 exposed.

Figure 10:
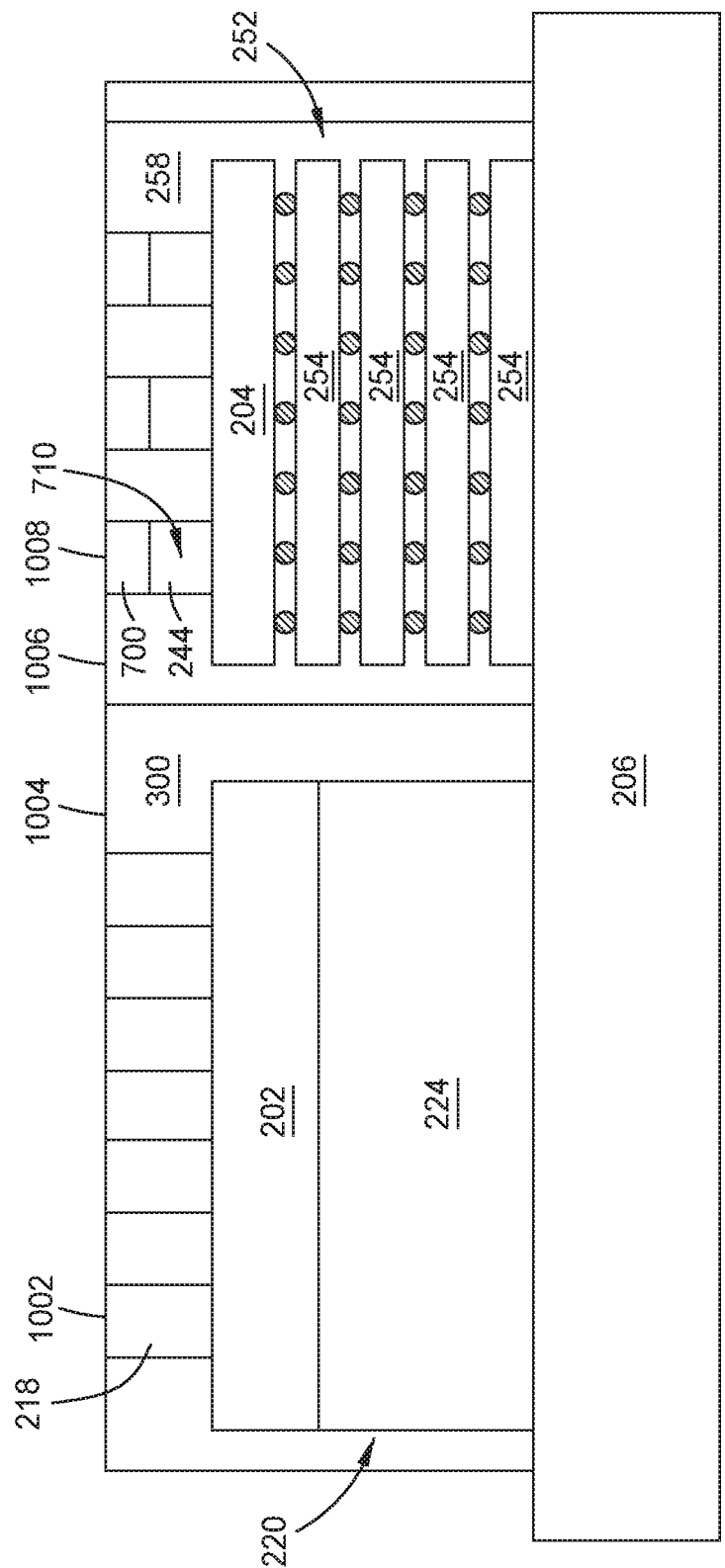

At operation 116, the pillars 218, 710 are made coplanar, as illustrated in FIG. 10. For example, portions of at least one or more of the distal ends 402, 702 of the pillars 218, 710, and the surface 302 of the second mold compound 300 farthest from the carrier 206 are removed such that resultant surfaces 1002, 1004, 1006, 1008 respectively of the first pillars 218, the second (e.g., replacement) pillars 710 and the mold compounds 258, 300 are made coplanar. The surfaces 1002, 1004, 1006, 1008 may be made coplanar by milling, etching, grinding or other suitable technique. In one example, the surfaces 1002, 1004, 1006, 1008 are only ground such that most of the pillars 218, 710 remain intact. That is after grinding, the remaining heights of the pillars 218, 710 is just slightly less than the height of the shorter pillar 218, 240. For example after grinding at operation 116, the heights of the pillars 218, 710 may be in the range of about 15 μm to about 30 μm. In this manner, the mold compounds 258, 300 are not subjected to excessive grinding so that stress and cracks initiation are essentially prevented. Moreover, as the ground pillars 218, 710 have the same height, stress and cracks are not propagated into to the subsequently deposited redistribution layer as later described below, substantially inhibiting damage to the routings forming the circuitry of the redistribution layer. As a result, a robust and reliable mechanical and electrical connection between the die 202, 204 and the redistribution layer can be formed that consequently improves the life, reliability and performance of the final chip package assembly.

Figure 11:
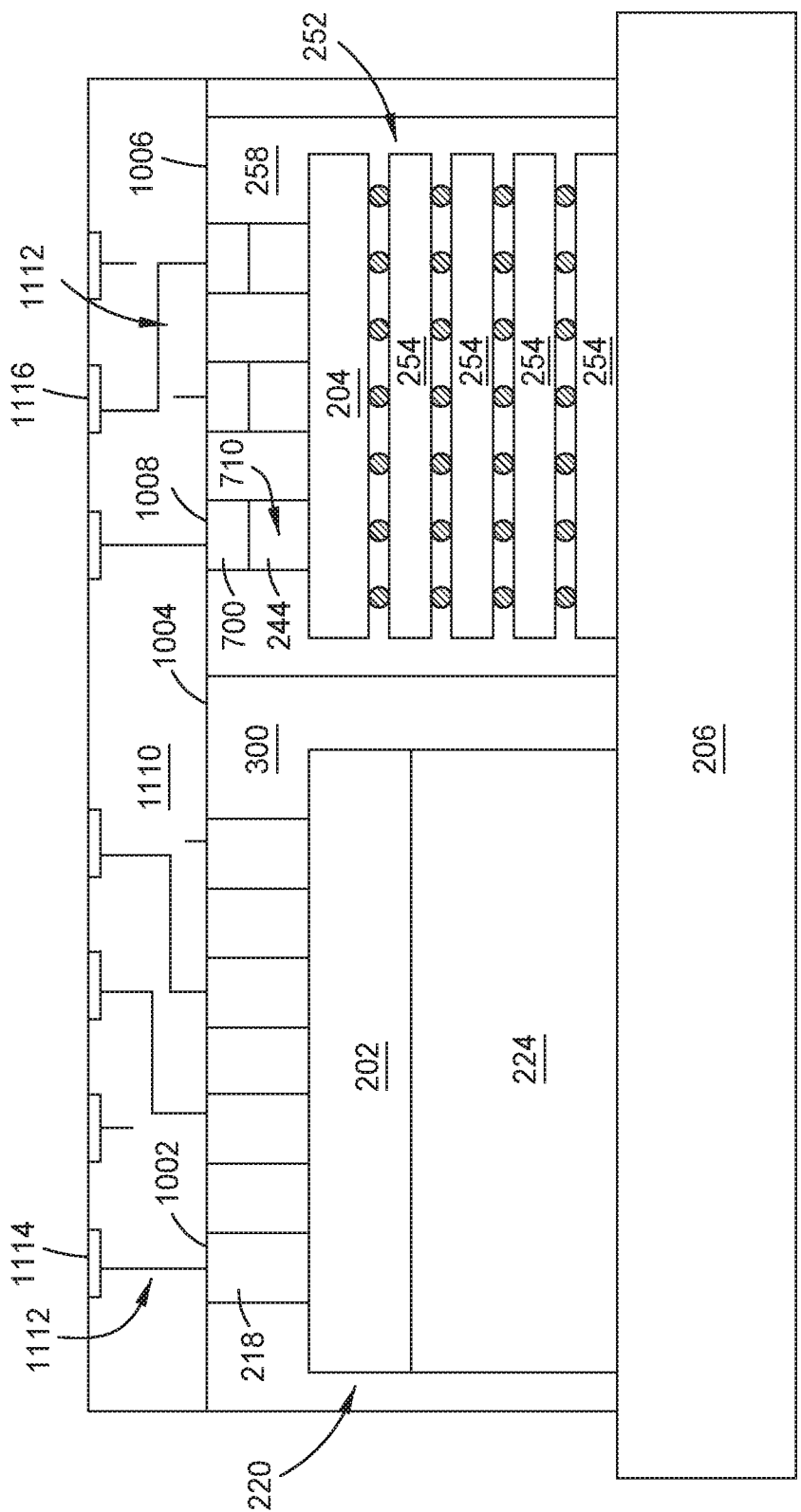

At operation 118, a redistribution layer 1110 is formed on the exposed surfaces 1002, 1008 of the pillars 218, 710, as illustrated in FIG. 11. The layer 1110 includes circuitry 1112 formed by the vias and lines of the metalization layers of the redistribution layer 1110. The circuitry 1112 terminates at one side of the redistribution layer 1110 in conductive contact with the pillars 218, 710. The circuitry 1112 terminates at the other side of the redistribution layer 1110 in exposed conductive surfaces 1114, 1116 upon which solder balls are deposited.

Figure 12:
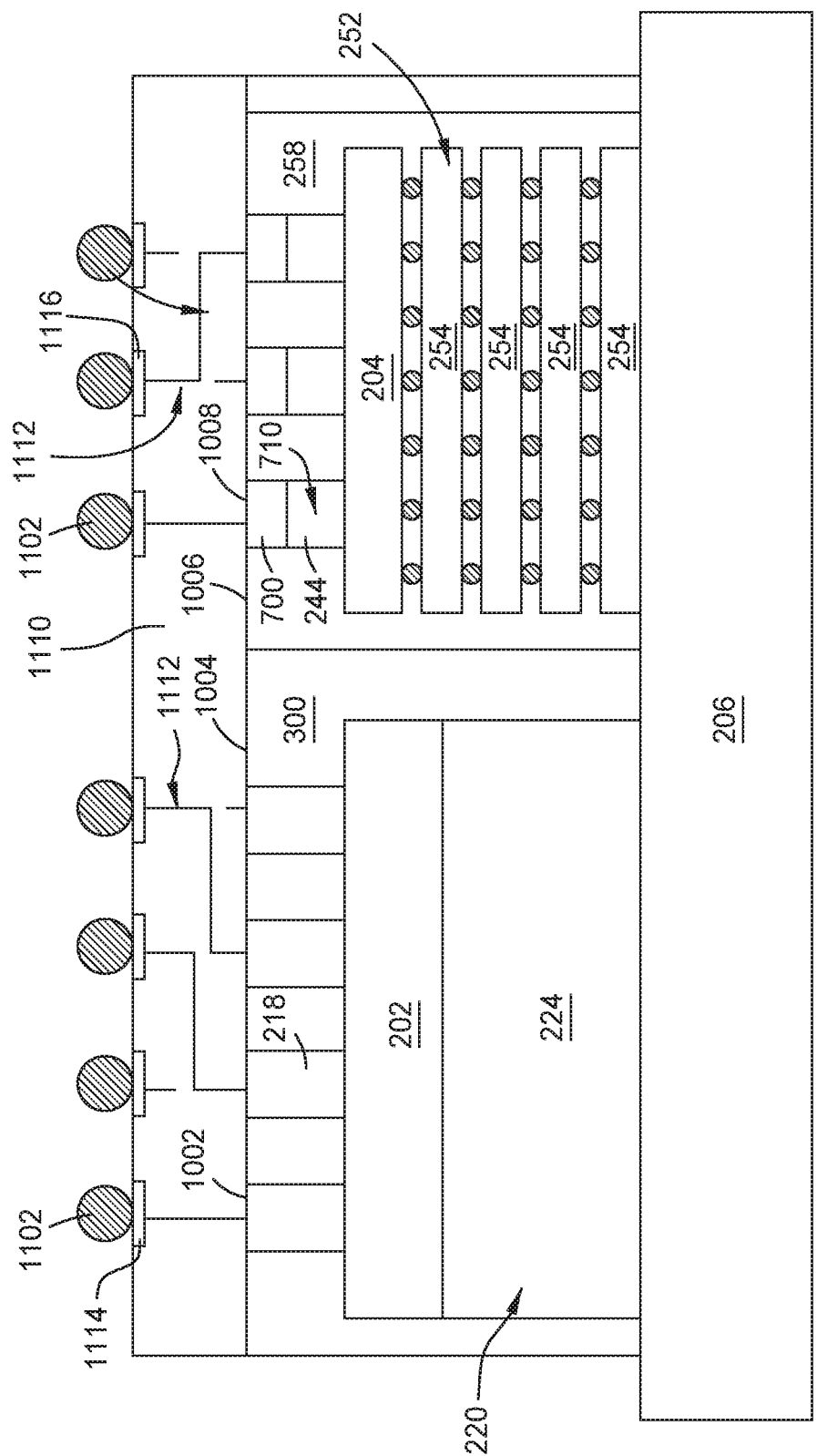
Figure 13:
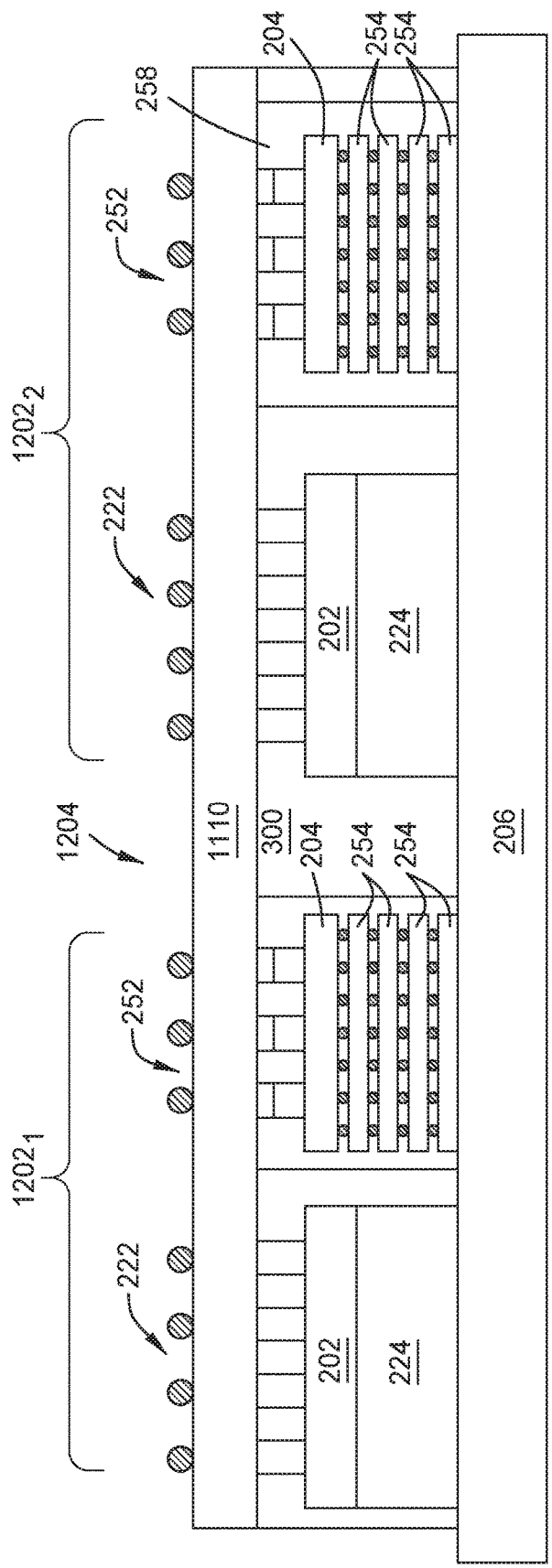

At operation 120, solder balls 1102 are disposed on the exposed conductive surfaces 1114, 1116 of the redistribution layer 1110, as illustrated in FIG. 12. At operation 122, predetermined groupings 1202 of die stacks 222, 252 are separated, as illustrated in FIGS. 12-13. For example, a first group 12021 of die stacks 222, 252 may be mounted to a common carrier 206 with a second group 12022 of die stacks 222, 252. A scribe lane 1204 is disposed between the adjacent groups 12021, 12022 as illustrated in FIG. 12, thus providing room to separate the groups 12021, 12022 using a dicing or other cutting process. The carrier 206 may be removed prior to, or after operation 122.

Figure 14:
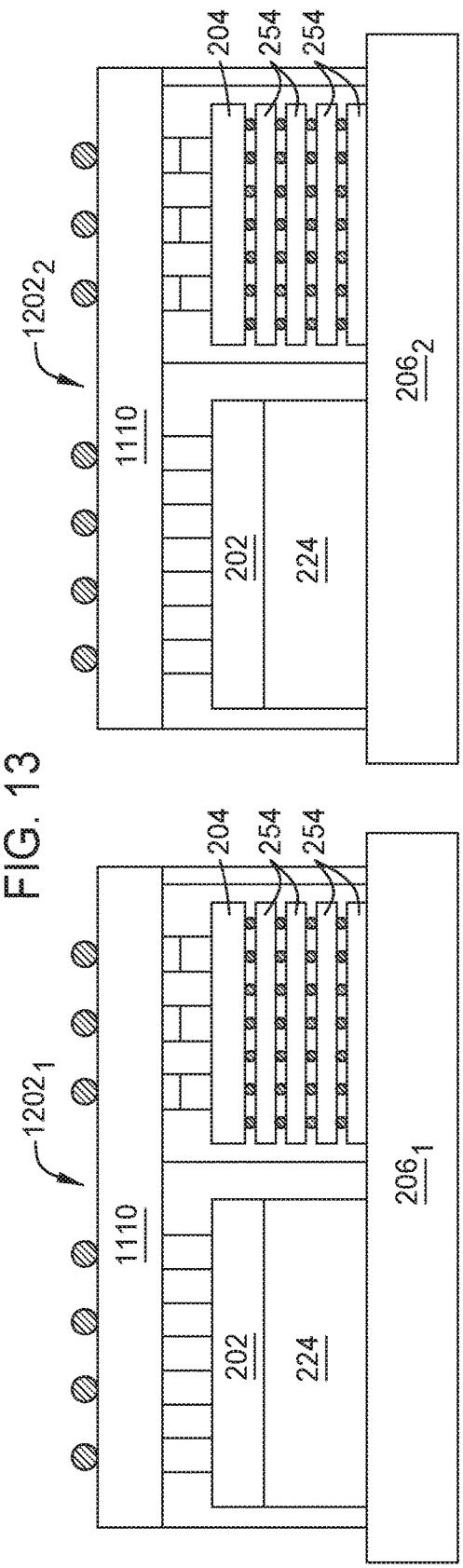
Figure 15:
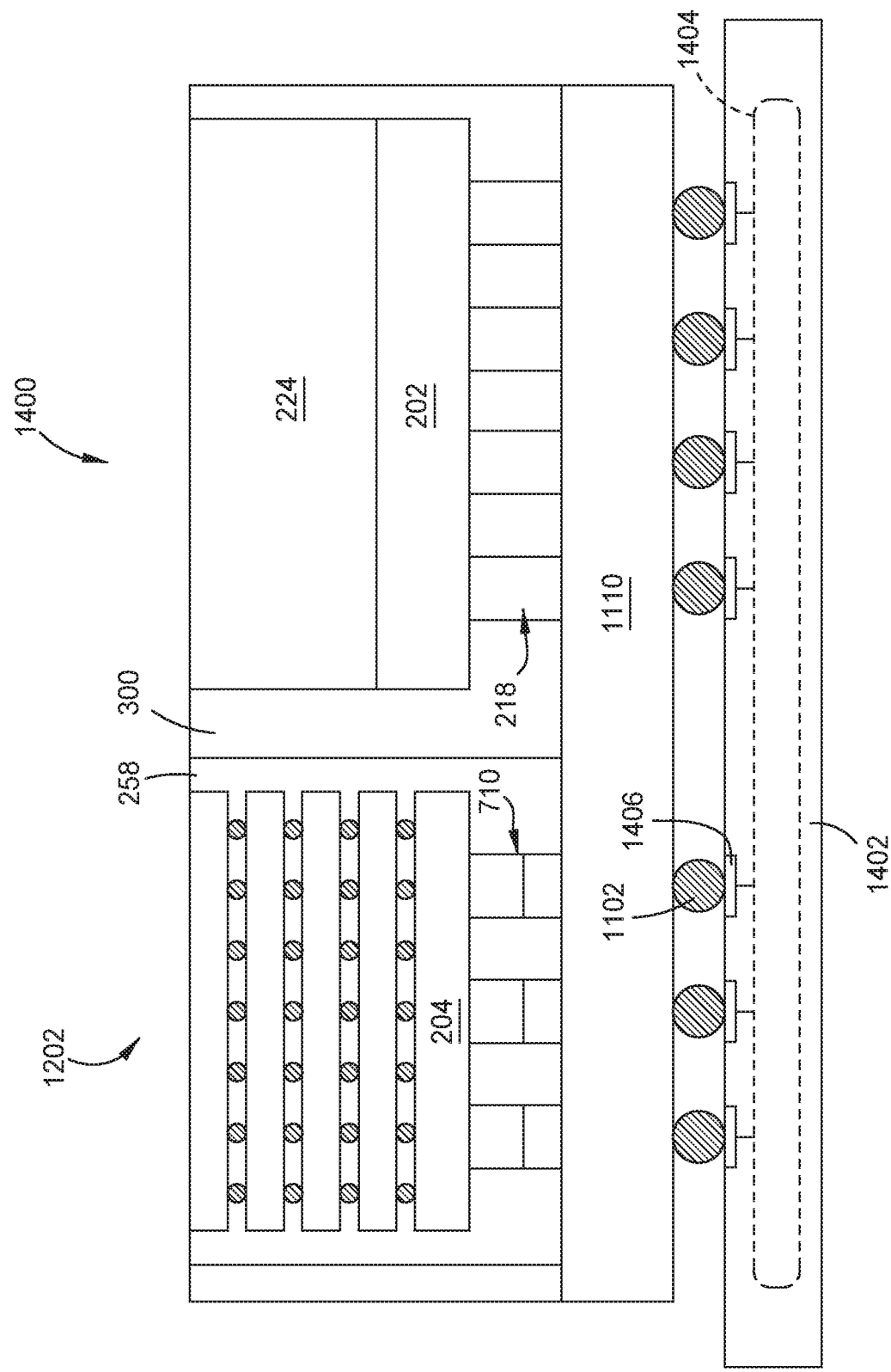

At operation 124, at least one group 1202 of die stacks 222, 252 are mounted to a package substrate 1402 to form a chip package assembly 1400, as illustrated in FIG. 14. The solder balls 1102 mechanically and electrically connect conductive landing pads 1406 formed on the package substrate 1402 to the exposed conductive surfaces 1114, 1116 of the redistribution layer 1110. The package substrate 1402 includes circuitry 1404 in the form of routing that terminates at the landing pads 1406. Thus, the solder balls 1102 facilitate transmission of ground, power and data signals between the circuitry 1404 of the package substrate 1402 and the circuitry 210, 232 of the IC dies 202, 204 through the circuitry 1112 of the redistribution layer 1110. The package substrate 1402 is subsequently mounted to a printed circuit board (PCB) to form an electronic device.

The replacement pillars 710 ensure that the electrical functionality of the chip package assembly 1400 is not compromised due to susceptibility to cracking, high stress, or poor solder joint formation. The replacement pillars 710, being made coplanar with the pillars 218 of the laterally adjacent IC die with comparatively little grinding compared to conventional techniques, cracking and damage to the redistribution layer disposed between the IC die and the package substrate is substantially prevented. As a result, the replacement pillars provide an exceptionally robust and reliable solder joint, and accordingly, a more robust, reliable, and better performing chip package. As an added benefit, the use of replacement pillars are particularly advantageous by allowing a wide variety of dies having dissimilar solder joint heights to be utilized within the same chip package because the dissimilar heights are compensated thought the use of the ground replacement pillars. As a result, package designers and fabricators have greater flexibility of product design without the need or cost of custom designs, still obtaining excellent reliability, performance and throughput with minimal expense.

While the foregoing is directed to embodiments of the present disclosure, other and further embodiments may be devised without departing from the basic scope thereof, and the scope thereof is determined by the claims that follow.

What is claimed is:

1. A chip package assembly comprising:
   a substrate having circuitry terminating at exposed landing pads;
   a first integrated circuit (IC) die having circuitry terminating at exposed contact pads;
   a first mold compound encapsulating the first IC die;
   first copper pillars extending from the exposed contact pads through the first mold compound, the first copper pillars fabricated from a first copper material;
   second copper pillars extending from the first copper pillars through the first mold compound, the second copper pillars fabricated from a second copper material having a composition different than that of the first copper material;
   a redistribution layer disposed on the first and second copper pillars;
   solder interconnects mechanically coupling the redistribution layer to the first and second copper pillars, the solder interconnects electrically coupling the circuitry of the substrate to the circuitry of the first IC die through the redistribution layer and first and second copper pillars.

2. The chip package assembly of claim 1, wherein the first IC die is part of a die stack comprising two or more memory dies, the first mold compound encapsulating the die stack.

3. The chip package assembly of claim 2 further comprising:
   a second IC die mounted to the substrate laterally spaced from the die stack; and
   a second mold compound encapsulating the second IC die and the die stack.

4. The chip package assembly of claim 3, wherein the second mold compound is disposed over the first mold compound.

5. The chip package assembly of claim 3, wherein the second IC die is a logic die.

6. The chip package assembly of claim 3, wherein the second IC die and the memory dies of the die stack are communicatively coupled through the substrate to form a high bandwidth memory device.

7. The chip package assembly of claim 3 further comprising:
   a seed layer disposed between the first and second copper pillars.

8. A chip package assembly formed by a method comprising:
   removing, from a first integrated circuit (IC) die encapsulated in a first mold compound, solder from first conductive pillars extending from a surface of the first IC die;
   forming second conductive pillars on the first conductive pillars from a copper material having a composition different than that of the first conductive pillars;
   forming a redistribution layer on the first and second conductive pillars; and
   forming solder connections to mount the redistribution layer to a substrate, the solder connections electrically coupling circuitry of the substrate to circuitry of the first IC die through the redistribution layer and first and second conductive pillars.

9. The chip package assembly of claim 8, wherein the method further comprises:
   mounting a logic die to the substrate adjacent to the first IC die, wherein the first IC die has a plurality of a memory dies stacked thereon and encapsulated in a first mold compound, the first conductive pillars disposed in the first mold compound, the first IC die, the plurality of a memory dies, and the first mold compound forming a memory die stack; and
   encapsulating the logic die and the memory die stack in a second mold compound, the second conductive pillars disposed in the first mold compound.

10. A method for assembling a chip package assembly, the method comprising:
    removing, from a first integrated circuit (IC) die encapsulated in a first mold compound, solder from first conductive pillars extending from a surface of the first IC die;
    forming second conductive pillars on the first conductive pillars;
    forming a redistribution layer on the first and second conductive pillars; and
    forming solder connections to mount the redistribution layer to a substrate, the solder connections electrically coupling circuitry of the substrate to circuitry of the first IC die through the redistribution layer and first and second conductive pillars.

11. The method of claim 10, wherein removing the solder from first conductive pillars further comprises:
    removing a copper portion of the first conductive pillars disposed between the a nickel portion and the solder; and
    removing the nickel portion of the first conductive pillars.

12. The method of claim 10 further comprising:
    mounting a logic die and a memory die stack to a carrier, the first IC die part of the memory die stack and disposed furthest from the carrier, the logic die disposed laterally adjacent the memory die stack; and
    overmolding the logic die and the memory die stack with a first mold compound.

13. The method of claim 12 further comprising:
    grinding the first mold compound to expose the solder disposed on the first conductive pillars.

14. The method of claim 13 further comprising:
    covering exposed ends of copper pillars extending from the logic die with a resist.

15. The method of claim 14, wherein removing the solder from first conductive pillars further comprises:
    removing a copper portion of the first conductive pillars disposed between the a nickel portion and the solder; and
    removing the nickel portion of the first conductive pillars.

16. The method of claim 15, wherein forming the second conductive pillars on the first conductive pillars further comprises:
    plating the second conductive pillars on the first conductive pillars.

17. The method of claim 16 further comprising:
    removing the resist; and
    making the copper pillars extending from the logic die coplanar with the second conductive pillars.

18. The method of claim 17 further comprising:
    forming solder balls on the redistribution layer;
    removing the carrier; and separating the logic die and the memory die stack from other IC dies mounted to the carrier.

19. The method of claim 17, wherein removing the solder from first conductive pillars further comprises:

leaving holes in a mold compound exposing a copper portion of the first conductive pillars disposed in contact with a contact pad of the first IC die.

20. The method of claim 15, wherein forming the second conductive pillars on the first conductive pillars further comprises:

disposing a seed layer on the first conductive pillars; and
plating the second conductive pillars on the first conductive pillars.

* * * * *

UNITED STATES PATENT AND TRADEMARK OFFICE
CERTIFICATE OF CORRECTION

PATENT NO. : 11,373,989 B1
APPLICATION NO. : 17/006745
DATED : June 28, 2022
INVENTOR(S) : Jaspreet Singh Gandhi and Suresh Ramalingam Page 1 of 1

It is certified that error appears in the above-identified patent and that said Letters Patent is hereby corrected as shown below:

In the Claims

Column 10, Line 34, In Claim 11, delete "the a" and insert -- the --, therefor.

Column 10, Line 53, In Claim 15, delete "the a" and insert -- the --, therefor.

Signed and Sealed this
Sixteenth Day of August, 2022

Katherine Kelly Vidal
*Director of the United States Patent and Trademark Office*